(12) United States Patent
Lukanc et al.

(10) Patent No.: US 6,974,652 B1
(45) Date of Patent: Dec. 13, 2005

(54) LITHOGRAPHIC PHOTOMASK AND METHOD OF MANUFACTURE TO IMPROVE PHOTOMASK TEST MEASUREMENT

(75) Inventors: Todd P. Lukanc, San Jose, CA (US); Luigi Capodieci, Santa Cruz, CA (US); Bhanwar Singh, Morgan Hill, CA (US); Christopher A. Spence, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 165 days.

(21) Appl. No.: 10/699,748

(22) Filed: Nov. 3, 2003

(51) Int. Cl.⁷ ............................................. G01F 9/00
(52) U.S. Cl. ............................................... 430/5
(58) Field of Search ........................... 430/5, 30, 311; 382/144

(56) References Cited

U.S. PATENT DOCUMENTS

| | | | |
|---|---|---|---|
| 5,436,097 A * | 7/1995 | Norishima et al. | ............ 430/5 |
| 5,750,290 A | 5/1998 | Yasuzato et al. | |
| 6,589,699 B2 | 7/2003 | Kaneko et al. | |

\* cited by examiner

*Primary Examiner*—S. Rosasco
(74) *Attorney, Agent, or Firm*—Renner, Otto, Boisselle & Sklar, LLP

(57) ABSTRACT

A photomask for use in a lithographic process and a method of making a photomask are disclosed. A mask blank including a substrate, a sacrificial conductive layer disposed over the substrate and a radiation shielding layer disposed over the sacrificial conductive layer can be provided. Structures are then formed from the radiation shielding layer to define a pattern. Measurement of parameters associated with the structures are made with a measurement tool and, during the measuring, the sacrificial conductive layer provides a conductive plane to dissipate charge transferred to the mask by the measurement tool.

22 Claims, 2 Drawing Sheets

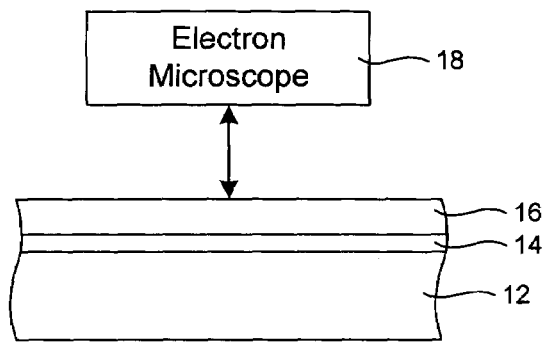
FIG. 1
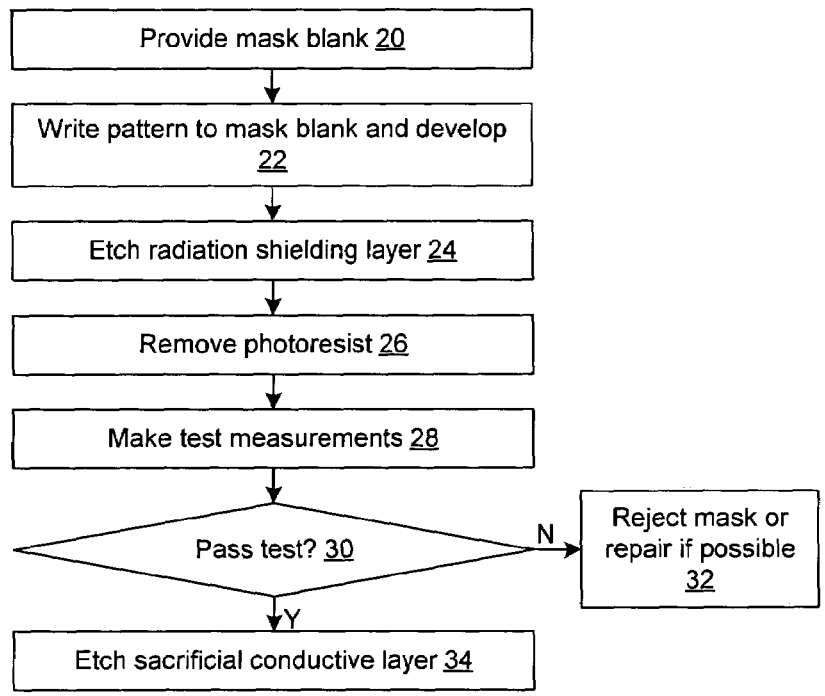
FIG. 2
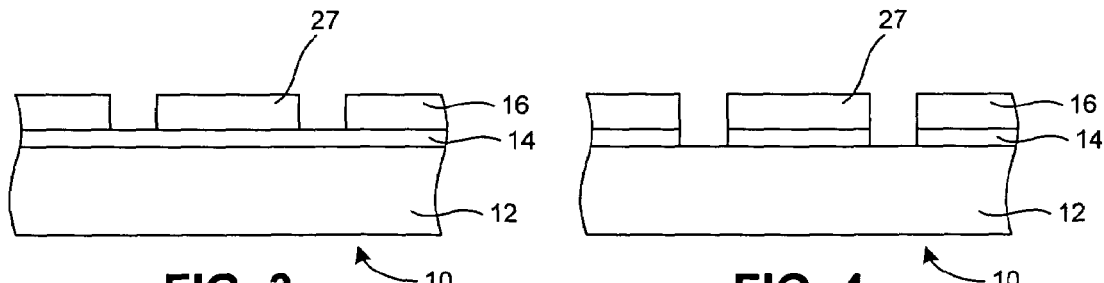
FIG. 3     FIG. 4

LITHOGRAPHIC PHOTOMASK AND METHOD OF MANUFACTURE TO IMPROVE PHOTOMASK TEST MEASUREMENT

TECHNICAL FIELD

The present invention relates generally to the field of integrated circuit manufacture and, more particularly, to a photolithographic mask assembly and a method of making photomasks to improve testing of the photomasks.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photo resist layer disposed on the wafer by passing light energy through a mask having an arrangement to image the desired pattern onto the photo resist layer. As a result, the pattern is transferred to the photo resist layer. In areas where the photo resist is sufficiently exposed and after a development cycle, the photo resist material can become soluble such that it can be removed to selectively expose an underlying layer (e.g., a semiconductor layer, a metal or metal containing layer, a dielectric layer, etc.). Portions of the photo resist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photo resist layer can be removed.

There is a pervasive trend in the art of IC fabrication to increase the density with which various structures are arranged. As a result, there is a corresponding need to increase the quality of the masks used in lithographic processes. To check the quality of a mask, a variety of tests may be preformed. One example test is a critical dimension (CD) measurement of the mask features. CD measurement is often carried out by using a scanning electron microscope (SEM) to measure features of the mask, including features of a patterned radiation shielding layer (e.g., a chrome layer) and/or features of a substrate (e.g., a quartz substrate) of the mask. Unfortunately, use of the SEM itself can lead to charging of regions of the mask, such as regions of the substrate. This charging can, in turn, lead to reduced accuracy of the measurement taken with the SEM.

Accordingly, there exists a need in the art for improved photomasks and techniques for improved testing of photomasks.

SUMMARY OF THE INVENTION

According to one aspect of the invention, the invention is directed to a method of making a photomask for use in a lithographic process. The method can include providing a mask blank including a substrate, a sacrificial conductive layer disposed over the substrate and a radiation shielding layer disposed over the sacrificial conductive layer; forming structures from the radiation shielding layer to define a pattern; and measuring parameters associated with the structures with a measurement tool, during the measuring the sacrificial conductive layer provides a conductive plane to dissipate charge transferred to the mask by the measurement tool.

According to another aspect of the invention, the invention is directed to a photomask for use in a lithographic process. The photomask can include a substrate; a sacrificial conductive layer disposed over the substrate; and a radiation shielding layer disposed over the sacrificial conductive layer, the radiation shielding layer having structures defining a pattern. During measurement of parameters associated with the structures of the radiation shielding layer with a measurement tool, the sacrificial conductive layer provides a conductive plane to dissipate charge transferred to the mask by the measurement tool.

BRIEF DESCRIPTION OF DRAWINGS

These and further features of the present invention will be apparent with reference to the following description and drawings, wherein:

FIG. 1 is a schematic block diagram of an example photomask undergoing testing with an electron microscope;

FIG. 2 is a flow diagram of an example technique for making and testing a photomask;

FIG. 3 is a partial cross-section of an example photomask during an intermediate stage of manufacture;

FIG. 4 is a partial cross-section of an example photomask following testing and etching of a sacrificial layer;

DISCLOSURE OF INVENTION

Figure 5:
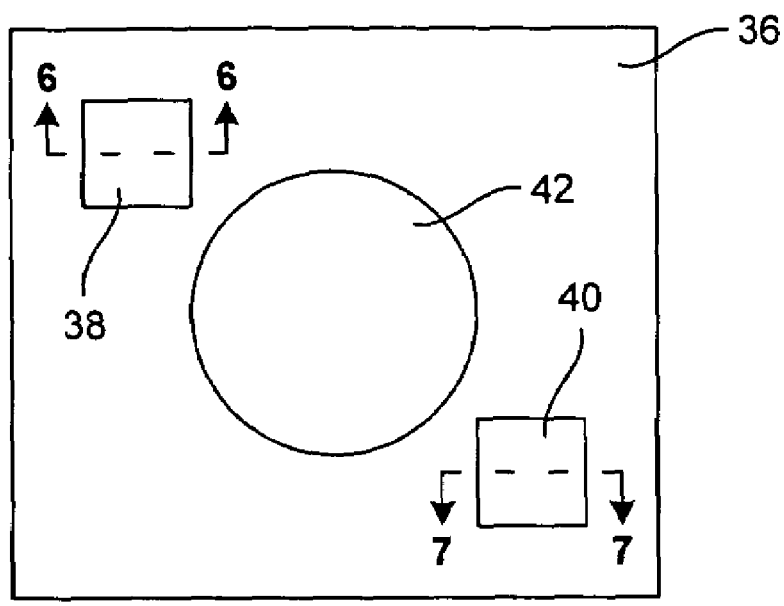
FIG. 5 is a top view of a photomask with test measurement regions.

In the detailed description that follows, similar components have been given the same reference numerals, regardless of whether they are shown in different views and/or embodiments. To illustrate the various aspects of the invention in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The description herein is presented in the exemplary context of fabricating a photomask (also referred to herein as a mask or a reticle) for use in the lithographic processing of a wafer having an integrated circuit (IC) formed thereon. Example ICs include general purpose microprocessors made from thousands or millions of transistors, a flash memory array or any other dedicated circuitry. One skilled in the art will appreciate that the methods and devices described herein can also be applied to the fabrication of any article manufactured using lithography, such as micromachines, disk drive heads, gene chips, micro electromechanical systems (MEMS) and so forth.

The apparatus and methods described herein can provide for improving the testing of masks, including the measurement of features relating to a radiation shielding layer and/or a substrate of the mask. The measured features can include measurement of critical dimension (CD). Briefly, feature measurement can be improved by providing a sacrificial conductive layer between the radiation shielding layer and the substrate. Furthermore, the mask manufacturing process can include forming a pattern in the mask shielding layer, making a test measurement and then etching the sacrificial layer, where during the test measurement the sacrificial layer reduces charge build up caused by a measurement tool such as a scanning electron microscope (SEM).

As used herein, the term radiation shielding layer is used in its broadest sense and can comprise any material layer or group of layers that can be arranged (e.g., patterned) to selectively transmit radiation (e.g., light energy) to expose a corresponding arrangement on a wafer. The radiation shielding layer can include a layer or layers intended to block, attenuate, phase shift and/or invoke any other desired characteristic into an exposure dose. The radiation shielding layer can include, for example, a single layer or multiple layers as well as an antireflective coating (ARC) layer and/or a bottom antireflective coating (BARC) layer. The radiation shielding layer can be made from or can include materials selected from a myriad of materials used for creating such layers. A principle material that can be used is chromium (Cr) and compounds containing chromium, including without limitation, chrome (e.g., chromium oxide) and chromium oxide-nitride (e.g., CrON). Other leading materials for use in the shielding layer include molybdenum (Mo), silicon (Si) and their combination (e.g., MoSi) and compounds containing molybdenum and/or silicon, such as oxides (e.g., MoSiO), nitrides and oxy-nitrides (e.g., MoSiON). Carbon (C) can also be use in combination with other elements, such as a CrCO layer, a CrCON layer, a combination of CrCO and CrCON layers and so forth. Other materials that can be used in the shielding layer exist and the identification of specific materials herein should not be considered limiting.

The mask can be used, for example, in an integrated circuit processing arrangement (not shown) that includes a lithography system used to image a pattern onto a wafer, or a region thereof. The system can be, for example, a step-and-repeat exposure system or a step-and-scan exposure system, but is not limited to these example systems. The system can include a light source for directing light energy towards the mask. The light energy can have, for example, a deep ultraviolet (DUV) wavelength (e.g., about 248 nm or about 193 nm) or a vacuum ultraviolet (VUV) wavelength (e.g., about 157 nm).

The mask selectively blocks light energy such that a light energy pattern defined by the mask is transferred towards the wafer. An imaging subsystem, such as a stepper assembly or a scanner assembly, sequentially directs the energy pattern transmitted by the mask to a series of desired locations on the wafer. The imaging subsystem may include a series of lenses and/or reflectors for use in scaling and directing the energy pattern towards the wafer in the form of an imaging (or exposure) light energy pattern.

Turning initially to FIG. 1, illustrated is a schematic block diagram of an example photomask 10 fabricated in accordance to the present invention. The photomask includes a substrate 12. Over the substrate 12 is a sacrificial conductive film or layer 14 and over the sacrificial conductive layer 14 is a radiation shielding layer 16. Although not shown in FIG. 1, the radiation shielding layer 16 can be patterned for use in exposing a wafer with an integrated circuit processing arrangement as described above.

The substrate 12, which is preferably transmissive of the exposure wavelength, can be made from any suitable material, an example of which is quartz. As is known in the art, the substrate 12 may be selectively etched to provide desirable features that impart certain characteristics into the exposure pattern.

The sacrificial conductive layer 14 can be made from any suitable material to serve the functions described herein. Example, materials for the sacrificial conductive layer 14 include, but are not limited to, aluminum (Al), copper (Cu) and titanium nitride (TiN). As should be appreciated, other suitable materials exist for the sacrificial conductive layer 14 and the identification of certain materials herein should not be considered limiting.

For reasons that will become apparent, the conductive layer 14 should have etch characteristics that differ from the radiation shielding layer 16. In one embodiment, the radiation shielding layer 16 should be etchable by a reactant that has little or substantially no reaction with the conductive layer 14 and the conductive layer 14 should be etchable by a reactant that has little or substantially no reaction with the shielding layer 16. In an alternative arrangement, the conductive layer 14 can be associated with an etch stop layer so that etching of the overlying radiation shielding layer 16 can be terminated at a desired point with minimal etching of the conductive layer 14.

The conductive layer 14 can be deposited or grown by any suitable technique for the desired material, such as sputtering. In one embodiment, the conductive layer 14 can have a thickness of about 5 nm to about 25 nm.

As indicated, the shielding layer 16 can include one or more layers that can be made from a variety of materials. The shielding layer 16 can also be associated with an ARC layer and/or a BARC layer. In one example embodiment, the shielding layer 16 can be made from chromium oxide-nitride (e.g., CrON) and can have a thickness of about 60 nm to about 120 nm.

As illustrated in FIG. 1, the mask 10 can be tested to ensure that parameters associated with the mask and/or the pattern defined by the shielding layer 16 meets certain tolerances. In the illustrated example, features of the mask 10 are tested for critical dimension (CD) accuracy using an electron microscope 18, such as a scanning electron microscope (SEM) or a scanning/tunneling electron microscope. The electron microscope 18 can be used to detect various features of the mask 10, including the CD of structures patterned from the shielding layer 16 and/or the CD of substrate 12 features.

During testing with the electron microscope 18, the conductive layer 14 functions to dissipate charge that would otherwise have a tendency to build-up in localized regions of the mask 10. The conductive layer 14 serves as a conductive pathway for the electrons from the electron microscope 18 to dissipate so that charge does not have any opportunity to build up in any given localized region of the mask 10. In effect, the conductive layer 14 functions as a conductive plane between the substrate 12 and the shielding layer 16. It is recognized that, in some cases, the shielding layer 16 may be made from a conductive material or include a conductive material layer. But, the pattern etched into the shielding layer 16 can cause discontinuities in the shielding layer 16 that prevent the shielding layer 16 from dissipating charge from certain localized regions of the mask 10. As should be appreciated, the conductive layer 14 can be arranged to dissipate charge, but need not be a continuous layer under the entire area of the shielding layer 16.

The dispersion of charge using the conductive layer 14 can occur naturally, such as by the natural tendency of electrons to repel one another. In another embodiment, the electrons can be bled off by connecting (e.g., by a direct conductive pathway or capacitive coupling) the conductive layer 14 to a voltage potential, such as by grounding the conductive layer 14. A mechanical probe can be used to establish such connection from the conductive layer 14 to the voltage potential. In cases where the shielding layer 16 is conductive, electrical connection between the conductive layer 14 and a desired voltage potential can be made through the shielding layer 16. In any of these embodiments, care should be used to avoid electrostatic discharge from the mask 10 that could lead to damage of the mask 10.

As indicated, localized charge build up in certain regions of the mask 10 can negatively impact the accuracy of the measurement with the electron microscope 18. Therefore, the presence of the conductive layer 14 can improve testing of the mask 10, such as when the electron microscope 18 is used to measure the CD of shielding layer 16 features and/or the CD of substrate 12 features.

With additional reference to FIG. 2, an example method of making and testing the mask 10 is shown. The method can begin in block 20 where a mask blank is provided. For example, the mask blank can be acquired or manufactured. The mask blank should include the substrate 12, the sacrificial conductive layer 14 and the radiation shielding layer 16, along with any other appropriate layers, such as a buffer layer(s), an etch stop layer(s), an ARC layer(s), a BARC layer(s) and so forth.

Next, in block 22, a pattern can be transferred to the mask blank, such as by a writing process. For example, the shielding layer 16 can be coated with a layer of energy sensitive material (e.g., a resist layer). Using a pattern generation tool, such as an mask writer outputting an appropriate light beam or electron beam, the resist can be exposed to a desired energy pattern. In areas where the resist is exposed to a threshold amount of radiation, the resist will become soluble. Accordingly, the resist can be developed to selectively expose the radiation shielding layer 16.

After development of the resist, the method can proceed to block 24 wherein the radiation shielding layer 16 can be etched. The etch technique can include wet etching. For chromium shielding layer films, wet etchants can include ceric ammonium nitrate (e.g., $Ce(NH_4)_2(NO_3)_6$) mixed with nitric, perchloric or acetic acid. For critical applications (e.g., where feature sizes are under 300 nm) dry etching can be used. For chromium shielding layer films, dry etchants can include mixtures of chlorine (Cl) and oxygen ($O_2$) with additional gasses to reduce etch-loading effects. As indicated by block 26, after etching of the radiation shielding layer 16, the remaining resist that served to protect the radiation shielding layer 16 from reaction with the etchant can be removed.

With additional reference to FIG. 3, shown is a portion of the mask 10 in an intermediate stage of manufacture, such as following block 26. Etching of the shielding layer 16 creates the desired pattern of structures 27 from the shielding layer. FIG. 3 shows areas of the radiation shielding layer 16 that were unprotected by the resist as being fully etched to expose the underlying sacrificial conductive layer 14. Etching of the shielding layer 16 should be carried out to avoid substantial etching of the conductive layer 14, such as by using an etchant that has little or no reaction with the conductive layer 14, by using an etch stop to indicate when etching of the shielding layer 16 is complete and/or other control mechanisms (e.g., controlling the etchant concentration and/or etch duration). Some etching of the conductive layer 14 can be tolerated so long as the electron dissipating properties of the conductive layer 14 are not compromised.

The method can proceed to block 28 where the mask 10 can be tested. An example test is a CD measurement of features of the shielding layer 16 and/or features of the substrate 12 using the electron microscope 18. During the test measurement of block 28, the conductive layer 14 dissipates charge transferred to the mask 10 from the electron microscope 18 that may otherwise accumulated in localized regions of the mask 10, such as by localized charging of the substrate 12 material. Accordingly, localized charge build up can avoided and accuracy of the test measurement can be improved.

Thereafter, data derived from the test measurement of block 28 can be analyzed to determine if the scanned mask 10 features are acceptable in block 30. If the mask features are unacceptable, the mask 10 can be rejected in block 32. In some cases, and depending on the defect, the mask 10 may alternatively be repaired in block 32.

If, in block 30, the mask features are acceptable, the method can proceed to block 34 where the sacrificial conductive layer 14 is selectively removed to form an operational mask 10 that can be used in the lithographic processing of a wafer. In one embodiment, the patterned defined by the shielding layer 16 is transferred to the conductive layer 14 as illustrated by example in FIG. 4. For example, the shielding layer 16 can be used as a protective mask layer for etching of the conductive layer 14. In this case, to avoid changes to the pattern defined by the shielding layer 16, the conductive layer 14 can be etched using an etchant with low or no reactivity with the shielding layer 16. Alternatively, a protective coating can be temporarily applied to the shielding layer 16. Unless otherwise desired, etching of the conductive layer 14 can be carried out to avoid etching of or damage to the substrate 12.

As should be appreciated, the method shown and described herein can be modified without departing from the scope of the invention. For example, certain blocks can be omitted and/or certain blocks can be carried out concurrently or with partial concurrence. Also, additional blocks can be added. For example, the method can be modified to include selectively etching the substrate 12.

In one embodiment, the sacrificial conductive layer 14 underlies the entire radiation shielding layer 16. In alternative embodiments, the sacrificial conductive layer 14 may extend only under a portion of the radiation shielding layer 16.

Figure 6:
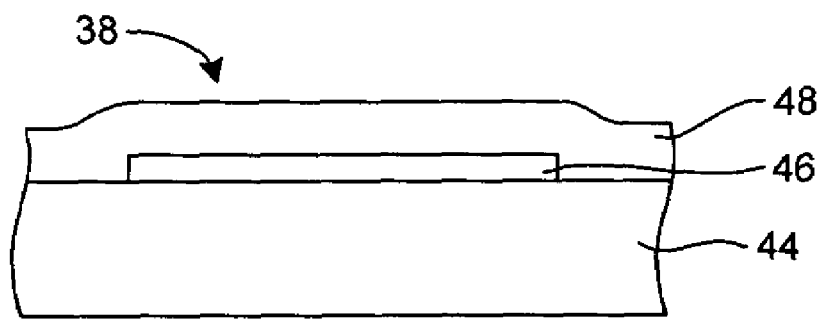
FIG. 6 is a cross-section taken along the line 6—6 of FIG. 5 showing an example configuration for a test measurement region.
Figure 7:
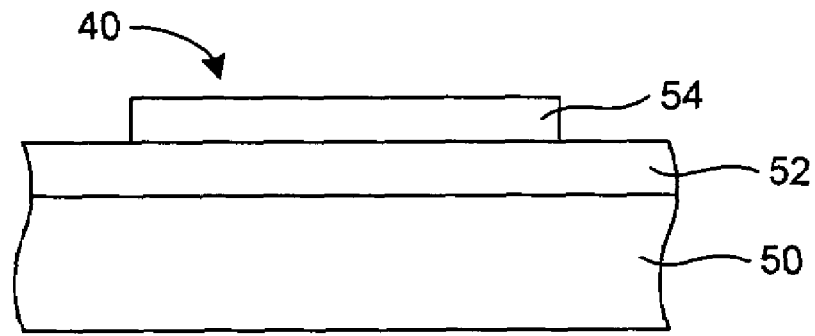
FIG. 7 is a cross-section taken along the line 7—7 of FIG. 5 showing another example configuration for another test measurement region.

Other example embodiments for a mask 36 with structures to improve testing of the mask 36 are illustrated in FIGS. 5–7. FIG. 5 is a top view of the mask 36 having two example test regions 38 and 40. The test regions 38, 40 may lie inside or outside a portion of the mask 36 used to generate the exposure pattern, or exposure pattern generating portion 42. Also, the test regions 38, 40 may be positioned to lie inside or outside of an area of the mask 36 protected by a pellicle (not shown). In situations where the test regions 36, 40 are not part of the exposure pattern generation portion 42 of the mask, the test regions 38, 40 serve as indicators of mask 36 quality for the exposure pattern generation portion 42 of the mask 36. For example, tests made on the test regions 38, 40 that indicate an acceptable CD of structures in the test regions 38, 40 can be used as a determining factor when deciding to accept or reject the mask 36 as a whole.

As should be appreciated, one of the test regions 38 or 40 can be omitted from the mask 36. Therefore, the following descriptions of the test region 38 and the test region 40 will be made as if only the corresponding test region is present on the mask 36. As should also be appreciated, additional test regions can be added to the mask 36 such that there are two or more test regions having features similar to test region 38 and/or such that there are two or more test regions having features similar to test region 40.

FIG. 6 is a cross-section of the test region 38. The area of the test region 38 can include a substrate 44, a sacrificial conductive region 46 and a radiation shielding layer 48. The substrate 44, the sacrificial conductive region 46 and the radiation shielding layer 48 respectively can be made to have the same properties as the substrate 12, the sacrificial conductive layer 14 and the radiation shielding layer 16. Therefore, materials, thicknesses, properties and other aspects of the substrate 44, the sacrificial conductive region 46 and the radiation shielding layer 48 will not be described in greater detail.

The sacrificial conductive layer 46 is present across the area of the test region 38 and does not extend into other portions of the mask 36, such as the exposure pattern generating portion 42. The mask 36 can be processed using aspects of the method shown and described with respect to FIG. 2. For example, the radiation shielding layer 48 can be imparted with a test pattern in the area of the test region 38 and with a pattern for generating the exposure pattern in the exposure pattern generating portion 42 of the mask 36. Thereafter, test measurements of structures in the test region 38 can be made. Based on the test measurements of the structures in the test region 38, a decision can be made as to whether to accept or reject the mask 36 as a whole. In embodiments where the test region 38 is outside the exposure pattern generating portion 42 of the mask 36, etching the sacrificial conductive layer 44 can be omitted.

FIG. 7 is a cross-section of the test region 40. The area of the test region 40 can include a substrate 50 having comparable features to the substrate 12. A radiation shielding layer 52, having comparable features to the radiation shielding layer 16, can be disposed over the substrate 50. A supplemental radiation shielding layer 54 can be disposed over the radiation shielding layer 52. The supplemental shielding layer 54 can have the same or similar properties as the shielding layer 52 in terms of features such as composition and thickness. If the test region 40 is present on a mask 36 that also has the test region 38, the substrate 44 and the substrate 50 can be the same (e.g., a continuous piece of material), and the shielding layer 48 and the shielding layer 52 can be the same (e.g., a continuous film).

The supplemental shielding layer 54 is present across the area of the test region 40 and does not extend into other portions of the mask 36, such as the exposure pattern generating portion 42. The mask 36 can be processed using aspects of the method shown and described with respect to FIG. 2. For example, the radiation shielding layer 52 can be imparted with a pattern for generating the exposure pattern in the exposure pattern generating portion 42 of the mask 36. During formation of the pattern for the exposure pattern generating portion 42 of the mask 36, a test pattern in the area of the test region 40 can be formed in the supplemental shielding layer 54. As a result, structures will be formed from the supplemental shielding layer 54 that can have comparable qualities to the structures formed in other portions of the mask 36. Thereafter, test measurements of structures in the test region 40 can be made. During this testing, the shielding layer 52 can assist in dissipating charge transferred to the mask 36 from the measurement tool. Based on the test measurements of the structures in the test region 40, a decision can be made as to whether to accept or reject the mask 36 as a whole.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of making a photomask for use in a lithographic process, comprising:
   providing a mask blank including a substrate, a continuous sacrificial conductive layer disposed over the substrate and a radiation shielding layer disposed over the sacrificial conductive layer;
   forming structures from the radiation shielding layer to define a pattern over the continuous sacrificial conductive layer; and
   measuring parameters associated with the structures with a measurement tool, and during the measuring, dissipating charge transferred to the mask by the measurement tool with the continuous sacrificial conductive layer acting as a conductive plane.

2. The method of claim 1, wherein after the measuring, the method further comprises selectively etching the sacrificial conductive layer to transfer the pattern defined by the radiation shielding layer to the sacrificial conductive layer.

3. The method of claim 1, wherein forming structures from the radiation shielding layer includes etching the radiation shielding layer with an etch process that has substantially no reaction with the sacrificial conductive layer.

4. The method of claim 3, wherein after the measuring, the method further comprises selectively etching the sacrificial conductive layer to transfer the pattern defined by the radiation shielding layer to the sacrificial conductive layer with an etch process that has substantially no reaction with the radiation shielding layer.

5. The method of claim 1, wherein the radiation shielding layer is comprised of CrON.

6. The method of claim 1, wherein the sacrificial conductive layer is comprised of a material selected from aluminum, copper, titanium nitride and combinations thereof.

7. The method of claim 1, wherein the measurement tool is an electron microscope.

8. The method of claim 1 further comprising accepting the mask if the measured parameters fall within acceptable tolerances, otherwise rejecting the mask.

9. The method of claim 1, wherein the measured parameters include critical dimension of the radiation shielding layer structures.

10. The method of claim 1, wherein the sacrificial conductive layer underlies the entire radiation shielding layer.

11. The method of claim 1, wherein the sacrificial conductive layer underlies a portion of the radiation shielding layer.

12. The method of claim 11, wherein the sacrificial conductive layer defines a test region of the mask and parameters of structures formed from the radiation shielding layer in the test region are measured as an indication of parameters associated with structures formed from the radiation shielding layer outside the test region.

13. The method of claim 1, further comprising connecting the sacrificial conductive layer to a voltage potential during the measuring.

14. The method of claim 13, wherein the voltage potential is ground.

15. A photomask for use in a lithographic process, comprising:
   a substrate;
   a continuous sacrificial conductive layer disposed over the substrate; and a radiation shielding layer disposed over the sacrificial conductive layer, the radiation shielding layer having structures defining a pattern over the continuous sacrificial conductive layer so that the sacrificial conductive layer provides a conductive plane to dissipate charge transferred to the mask by a measurement tool during measurement of parameters associated with the structures of the radiation shielding layer with the measurement tool.

16. The photomask of claim 15, wherein the radiation shielding layer can be etched by an etch process that has substantially no reaction with the sacrificial conductive layer.

17. The photomask of claim 15, wherein the sacrificial conductive layer can be etched by an etch process that has substantially no reaction with the radiation shielding layer.

18. The photomask of claim 15, wherein the radiation shielding layer is comprised of CrON.

19. The photomask of claim 15, wherein the sacrificial conductive layer is comprised of a material selected from aluminum, copper, titanium nitride and combinations thereof.

20. The photomask of claim 15, wherein the measurement tool is an electron microscope.

21. The photomask of claim 15, wherein the sacrificial conductive layer underlies the entire radiation shielding layer.

22. The photomask of claim 15, wherein the sacrificial conductive layer underlies a portion of the radiation shielding layer and defines a test region of the photomask and structures formed from the radiation shielding layer in the test region define test structures that have parameters indicative of parameters of structures formed from the radiation shielding layer outside the test region.

* * * * *